US008816951B2

(12) United States Patent
Wu et al.

(10) Patent No.: US 8,816,951 B2
(45) Date of Patent: Aug. 26, 2014

(54) SHIFT REGISTER UNIT, GATE DRIVE CIRCUIT, AND DISPLAY APPARATUS

(75) Inventors: Zhongyuan Wu, Beijing (CN); Liye Duan, Beijing (CN)

(73) Assignee: Boe Technology Group Co., Ltd., Beijing (CN)

( * ) Notice: Subject to any disclaimer, the term of this patent is extended or adjusted under 35 U.S.C. 154(b) by 121 days.

(21) Appl. No.: 13/304,535

(22) Filed: Nov. 25, 2011

(65) Prior Publication Data

US 2012/0133574 A1 May 31, 2012

(30) Foreign Application Priority Data

Nov. 26, 2010 (CN) .......................... 2010 1 0569110

(51) Int. Cl.
*G09G 3/20* (2006.01)
*G11C 19/28* (2006.01)

(52) U.S. Cl.
USPC .............................. 345/100; 345/55; 345/214

(58) Field of Classification Search
USPC .............................. 345/96, 100, 204, 214, 55
See application file for complete search history.

(56) References Cited

U.S. PATENT DOCUMENTS 7,595,783 B2 9/2009 Cho et al.
2004/0189585 A1 9/2004 Moon
2005/0083292 A1 4/2005 Moon et al.
2006/0145999 A1 7/2006 Cho et al.
2006/0262074 A1 11/2006 Shimoda
2007/0018918 A1 1/2007 Chung
2007/0040771 A1 2/2007 Chung et al.
2007/0248204 A1 10/2007 Tobita
2008/0055225 A1* 3/2008 Pak et al. ........................ 345/96
2008/0079701 A1* 4/2008 Shin et al. ...................... 345/204
2009/0167741 A1 7/2009 Tsai
2009/0195291 A1 8/2009 Tsuchi
2009/0303211 A1 12/2009 Hu
2010/0177082 A1 7/2010 Joo et al.

(Continued)

FOREIGN PATENT DOCUMENTS

CN 1881803 A 12/2006
CN 1901017 A 1/2007

(Continued)

OTHER PUBLICATIONS

KIPO NOA dated May 3, 2013.

(Continued)

*Primary Examiner* — Joseph Feild
*Assistant Examiner* — Andrew Sasinowski
(74) *Attorney, Agent, or Firm* — Ladas & Parry LLP

(57) ABSTRACT

A shift register unit, gate drive circuit, and display apparatus. The shift register unit comprises: input module for inputting first and second clock signals, frame start signal, high and low voltage signals, the first clock signal is identical with phase-inverted signal of the second clock signal within one frame; a processing module comprising multiple TFTs, for generating gate drive signal according to the first and second clock signals and frame start signal, controlling voltage of first node formed by TFTs lower than the low level of power supply signal during evaluation period of shift register unit, and resetting second node formed by TFTs to cut off transient DC path formed by input terminals of the high and low voltage signals, and at least one TFT in time; an output module for sending gate drive signal generated by the processing module.

19 Claims, 10 Drawing Sheets

(56) References Cited

U.S. PATENT DOCUMENTS

| | | | | |
|---|---|---|---|---|
| 2010/0245301 | A1 * | 9/2010 | Shang | 345/204 |
| 2012/0133574 | A1 | 5/2012 | Wu et al. | |
| 2012/0188210 | A1 | 7/2012 | Zhang et al. | |

FOREIGN PATENT DOCUMENTS

| | | | |
|---|---|---|---|
| CN | 1921016 | A | 2/2007 |
| CN | 101504867 | A | 8/2009 |
| CN | 101604551 | A | 12/2009 |
| CN | 101783124 | A | 7/2010 |
| JP | 2007-241028 | A | 9/2007 |
| KR | 20070118426 | A | 12/2007 |
| KR | 1020080008800 | A | 1/2008 |
| KR | 20080030212 | A | 4/2008 |
| KR | 20100108301 | A | 10/2010 |

OTHER PUBLICATIONS

First Chinese Office Action dated Aug. 27, 2013 Appln. 201010569110.1.

First Chinese Office Action dated Jun. 24, 2013; Appln. 201010569063.0.

USPTO NFOA dated Jan. 28, 2013 in connection with U.S. Appl. No. 13/301,019.

USPTO NOA mailed May 24, 2013 in connection with U.S. Appl. No. 13/301,019.

Second Chinese Office Action dated Mar. 11, 2014; Appln. No. 201010569110.1.

* cited by examiner

SHIFT REGISTER UNIT, GATE DRIVE CIRCUIT, AND DISPLAY APPARATUS

BACKGROUND

Embodiments of the present disclosure relate to a display drive technology, and in particular, relate to a shift register unit, a gate drive circuit, and a display apparatus.

In the display drive technology, scan lines and data lines cross each other to form an active matrix. The drive circuits for the scan lines are usually realized by shift registers. The shift registers can be categorized into dynamic shift registers and static shift registers. The structure of a dynamic shift register is relatively simple, which needs a small amount of Thin Film Transistor (TFT) devices; however, the power consumption of a dynamic shift register is relatively large, and its operation bandwidth is limited. The static shift register requires more TFT devices, but its operation bandwidth is large, and it costs less power. The factors, such as power consumption, reliability, and area, need to be considered together, when considering the performance of a shift register. However, the power consumption and reliability have become important performance parameters with the size of the display panel increasing.

FIG. 1A is a schematic structure of a shift register unit in a first prior art, and FIG. 1B is an operating timing diagram of the shift register unit in the first prior art. As shown in FIG. 1A and FIG. 1B, a feedback transistor M4 connected between the output terminal and the reset drive transistor M5 is used to automatically turn off M5 in the first prior art. In particular, during a period of evaluation of the output terminal, ck1 is in high level, the output is in low level, and thus M4 is turned on, whereby M5 is turned off. During a period of reset of the output terminal, ck1 is in the low level, M3 is turned on, and in turn M5 is turned on to charge the output terminal. FIG. 2A is a schematic structure of a shift register unit in a second prior art, and FIG. 2B is an operating timing diagram of the shift register unit in the second prior art. As shown in FIG. 2A and FIG. 2B, the feedback transistor M5 is connected between the output terminal and VDD by the control of a phase-inverted clock. During a period of evaluation of the output terminal, the output becomes in low level. M5 is turned on, and M1 is turned off, which results in that the output terminal remains at the low level. During a period of reset of the output terminal. CLK becomes the low level, which turns on M3, and in turn turning on M1, whereby the output terminal is charged by VDD.

However, since the output terminal is connected with a load, its potential changes relatively slow. For the first prior art, during the period of evaluation of the output terminal, it needs time to change the output terminal from the high level to the low level, and only when the voltage of the output terminal is lower than a preset threshold voltage. M4 is turned on. Before M4 is turned on. M5 is still in ON state, therefore, there exists a direct current (DC) path from VDD to VSS though M5 and M2. For the second prior art, during the period of reset of the output terminal, it needs time to change the output terminal from the low level to the high level, so M5 is not turned off in time, therefore, there exists a direct current (DC) path from VDD to VSS though M5 and M3. The existence of the DC path results in additional transient current, and increases power consumption of the shift register.

SUMMARY

The present disclosure provides a shift register unit, a gate drive circuit and a display apparatus, in order to eliminate the DC path, decrease the transient current, and reduce the power consumption of the shift register.

An embodiment of the present disclosure provides a shift register unit, comprising:

an input module for inputting a first clock signal, a second clock signal, a frame start signal, a high voltage signal, and a low voltage signal, wherein the first clock signal is identical with the phase-inverted signal of the second clock signal within the time interval of one frame; a processing module comprising a plurality of TFTs and connected to the input module, for generating a gate drive signal according to the first clock signal, the second clock signal, and the frame start signal, controlling to make the voltage of a first node formed by the TFTs lower than the low level of a power supply signal during a evaluation period of the shill register unit, and controlling to reset a second node formed by the TFTs, so as to cut off a transient DC path formed by the input terminal of the high voltage signal, the input terminal of the low voltage signal, and at least one TFT in time: an output module connected with the processing module for sending the gate drive signal generated by the processing module.

Another embodiment of the present disclosure provides a gate drive circuit, comprising n shift register units connected in sequence, wherein n is a positive integer, and the shift register units are the shill register unit described above: wherein the output module of the ith shift register unit is connected to the input module of the i+1th shill register unit to input the gate drive signal outputted from the ith shill register unit into the i+1 th shift register unit as the frame start signal of the i+1th shift register unit, wherein $i\in[1, n)$ and i is a positive integer; if the first clock signal input terminal of one of the shift register units is inputted with the first clock signal, and its second clock signal input terminal is inputted with the second clock signal, then the first clock signal input terminals of the previous shift register unit and the next shift register unit adjacent to the one of the shift register units are both inputted with the second clock signal, and the second clock signal input terminals of the previous shift register unit and the next shift register unit adjacent to the one of the shift register units are both inputted with the first clock signal; and the input module of the first shift register unit of the n shift register units is coupled with the frame start input signal from the external.

Further another embodiment of the present disclosure provides a display apparatus comprising the gate drive circuit described above.

The shift register unit, the gate drive circuit, and the display apparatus control the first node and the second node formed among the TFTs while generating the gate drive signal according to the clock signals, by configuring the input module, the processing module and the output module, such that the voltage of the first node is made lower than the low level of the power supply signal during the evaluation period of the shift register unit, and the second node is controlled to be reset, so as to cut off the transient DC path formed by the input terminal of the high voltage signal, the input terminal of the low voltage signal, and at least one TFT in time, which decreases the transient current, and reduces the power consumption of the shill register unit.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION

In order to make the objects, technical solutions, and advantages of the embodiments of the present disclosure more clear, a clear and complete description of the technical solutions of the embodiments of the present disclosure is made, in conjunction with the drawings accompanying the embodiments. Obviously, the described embodiments are only a part of the embodiments of the disclosure, but not all of them. All other embodiments obtained by those skilled in the art based on the embodiments in the present disclosure without any creative work will fall within the scope of the disclosure.

Figure 1A:
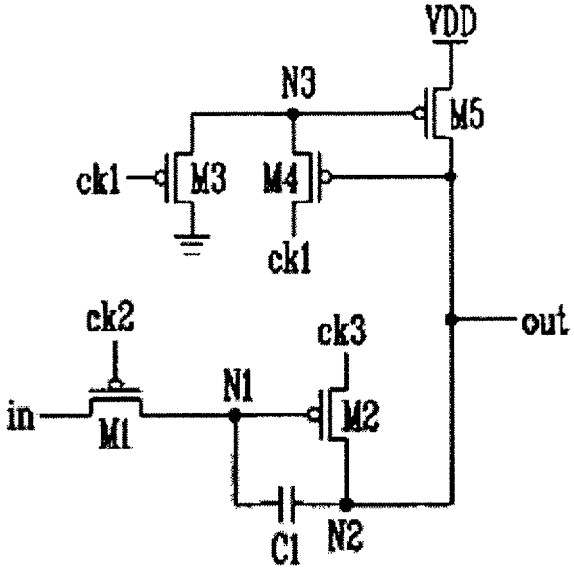
FIG. 1A is a schematic structure of a shift register unit in the first prior art.
Figure 1B:
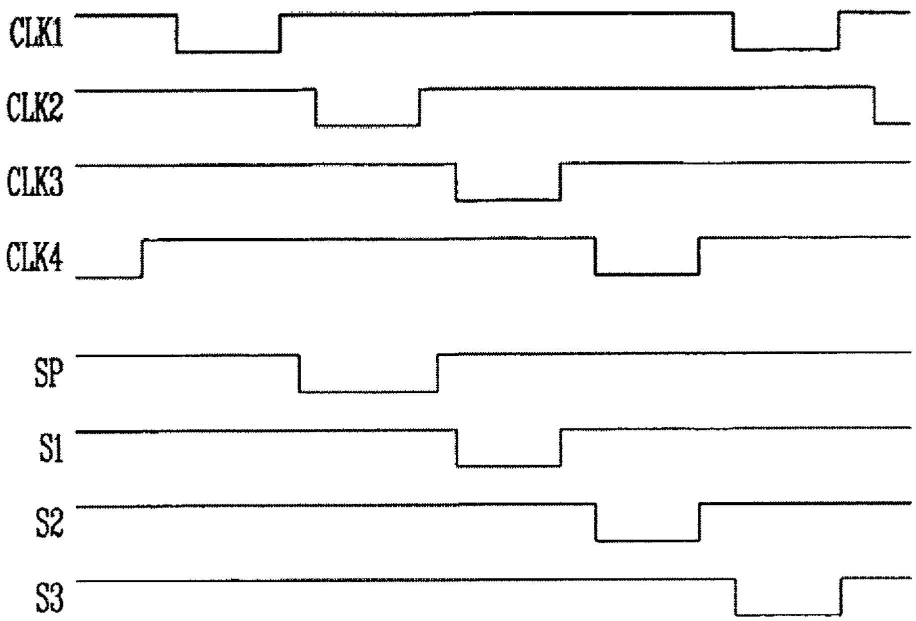
FIG. 1B is an operating timing diagram of the shift register unit in the first prior art.
Figure 2A:
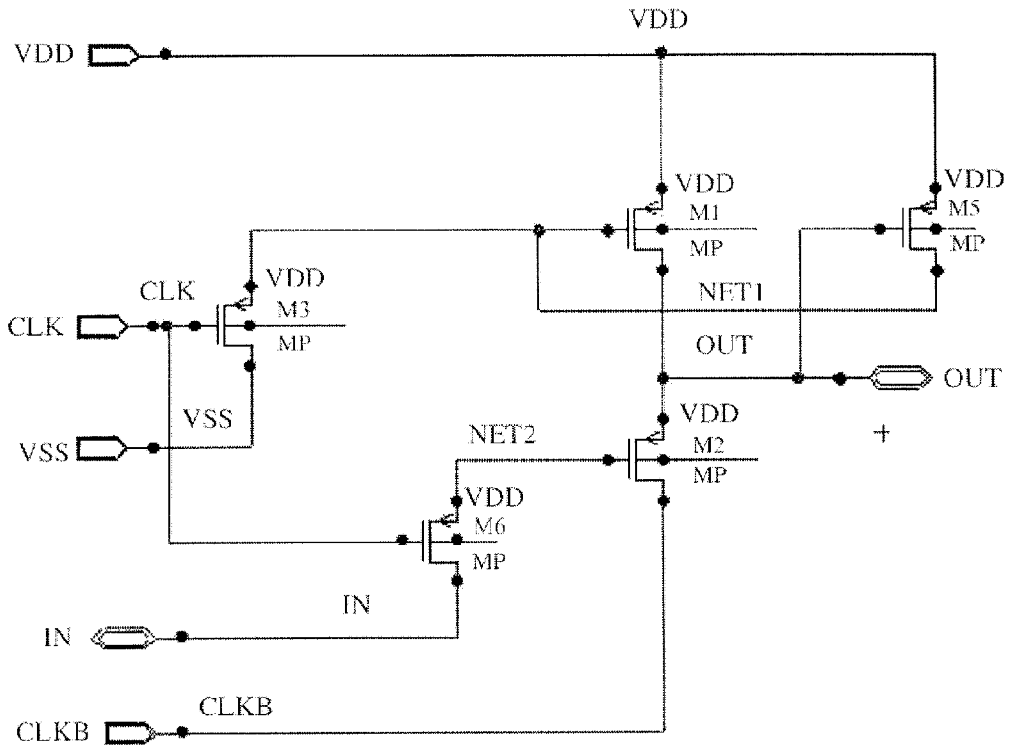
FIG. 2A is a schematic structure of a shift register unit in the second prior art.
Figure 2B:
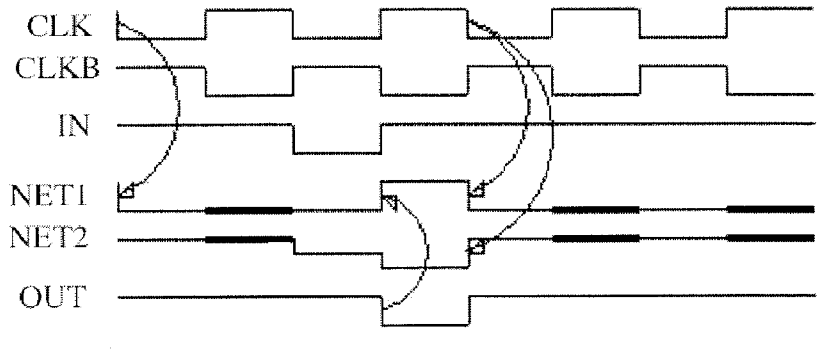
FIG. 2B is an operating timing diagram of the shift register unit in the second prior art.
Figure 3:
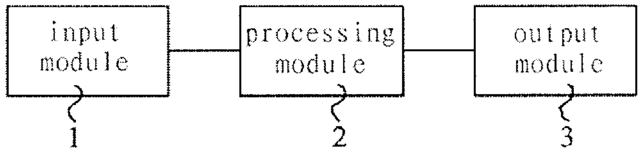
FIG. 3 is a schematic structure of a first embodiment of the shift register unit provided by the present disclosure.

FIG. 3 is a schematic structure of the first embodiment of the shift register unit provided by the present disclosure. As shown in FIG. 3, the embodiment provides a shift register unit that may comprise an input module 1, a processing module 2, and an output module 3. The input module 1 is used to input signals, which may include a first clock signal, a second clock signal, a frame start signal, a high voltage signal, and a low voltage signal, wherein the first clock signal and the phase-inverted signal of the second clock signal are the same within the time interval of one frame. The processing module 2 comprising a plurality of TFTs is connected to input module 1, and generates a gate drive signal according to the first clock signal, the second clock signal, and the frame start signal. The processing module 2 controls to make the voltage of a first node formed by the TFTs lower than the low voltage of the power supply signal during the evaluation period of the shift register units, and controls to reset a second node formed by the TFT's, so as to cut off a transient DC path formed by the input terminal of the high voltage signal, the input terminal of the low voltage signal, and at least one TFT in time. The output module 3 is connected with the processing module 2, and sends the gate drive signal generated by the processing module 2.

The embodiment provides a shift register unit, wherein by configuring the input module, the processing module and the output module, the first node and the second node formed among the TFTs is controlled while the gate drive signal is generated according to the clock signals, such that the voltage of the first node is lower than the low voltage of the power supply signal during the evaluation period of the shift register units, and the second node is reset, so as to cut off the transient DC path formed by the input terminal of the high voltage signal, the input terminal of the low voltage signal, and at least one TFT in time, which reduces the transient current, and reduces the power consumption of the shift register unit.

Figure 4:
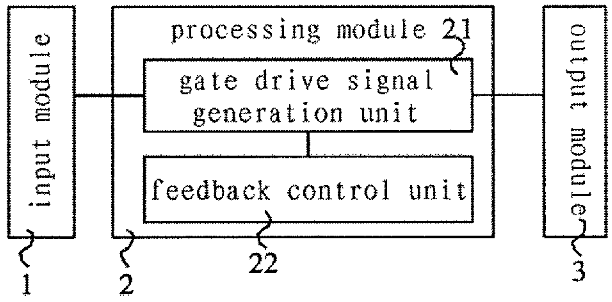
FIG. 4 is a schematic structure of a second embodiment of the shift register unit provided by the present disclosure.

FIG. 4 is the schematic structure of the second embodiment of the shift register unit provided by the present disclosure. As shown in FIG. 4, the embodiment provides a shift register unit, wherein the processing module 2 may specifically comprise a gate drive signal generation unit 21 and a feedback control unit 22 on the basis of the structure shown in FIG. 3. The gate drive signal generation unit 21, which may comprise at least an evaluation TFT and a reset TFT, is connected with the input module 1, and generates the gate drive signal according to the first clock signal, the second clock signal, and the frame start signal. The ON and OFF of the evaluation TFT is driven by the first node, and the ON and OFF of the reset TFT is driven by the second node. The feedback control unit 22 is connected with the gate drive signal generation unit 21, is used for controlling to make the voltage of the first node formed by the TFTs lower than the low voltage of the power supply signal during the evaluation period of the shift register units, and controlling to reset the second node formed by the TFTs, so as to cut off a transient DC path formed by the input terminal of the high voltage signal, at least one TFT, and the input terminal of the low voltage signal in time.

Figure 5:
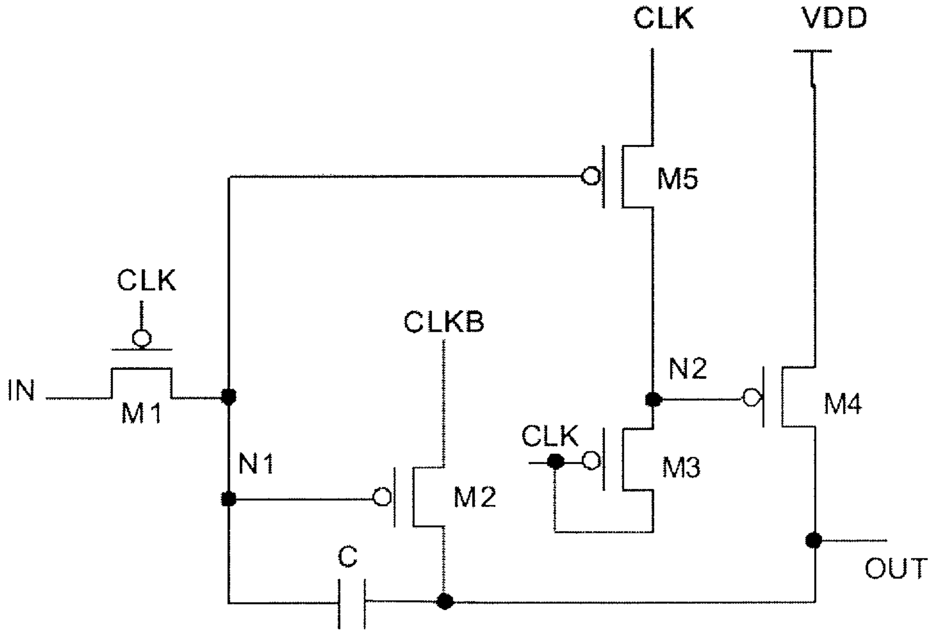
FIG. 5 is a schematic structure of a third embodiment of the shift register unit provided by the present disclosure.

FIG. 5 is a schematic structure of the third embodiment of the shift register unit provided by the present disclosure. As shown in FIG. 5, the input module of the shift register unit provided by the embodiment may specifically comprise an initial signal input terminal (IN), a first clock signal input terminal (CLKB), a second clock signal input terminal (CLK), a high voltage signal input terminal (VDD), and a low voltage signal input terminal (VSS) on the basis of the second embodiment described above. The initial signal input terminal (IN) is used to input the frame start signal, the first clock signal input terminal (CLKB) is used to input a first clock signal, the second clock signal input terminal (CLK) is used to input a second clock signal, the high voltage signal input terminal (VDD) is used to input the high voltage signal, and the low voltage signal input terminal (VSS) is used to input the low voltage signal. In this embodiment, the output module of the shift register unit may specifically comprise a output terminal (OUT) for sending the gate drive signal generated by the gate drive signal generation unit, and inputting the gate drive signal into the initial signal input terminal (IN) of the next shift register unit.

In particular, the gate drive signal generation unit of the shift register unit according to this embodiment may comprise a second TFT M2, and a fourth TFT M4. The second TFT M2 may in particular be the evaluation TFT in the embodiment, the source of the second TFT M2 is connected to the output terminal (OUT) of the output module, and the drain of the second TFT M2 is connected to the first clock signal input terminal (CLKB). The fourth TFT M4 may in particular be the reset TFT in this embodiment. The source of the fourth TFT M4 is connected to the output terminal (OUT), and the drain of the fourth TFT M4 is connected to the high voltage signal input terminal (VDD).

As shown in FIG. 5, a feedback control unit of the shift register unit provided by the embodiment may specifically comprise a first TFT M1, a third TFT M3, and a fifth TFT M5. The gate of the first TFT M1 is connected to the second clock signal input terminal (CLK), and the source of the first TFT M1 is connected to the initial signal input terminal (IN). The gate and the source of the third TFT M3 are both connected to the second clock signal input terminal (CLK). The drain of the fifth TFT M5 is connected to the second clock signal input terminal (CLK).

Further, as shown in FIG. 5, in the embodiment, the drain of the first TFT M1, the gate of the second TFT M2, and the gate of the fifth TFT M5 are connected together to form the first node N1. The drain of the third TFT M3, the gate of the fourth TFT M4, and the source of the filth TFT M5 are connected together to form the second node N2.

Figure 6:
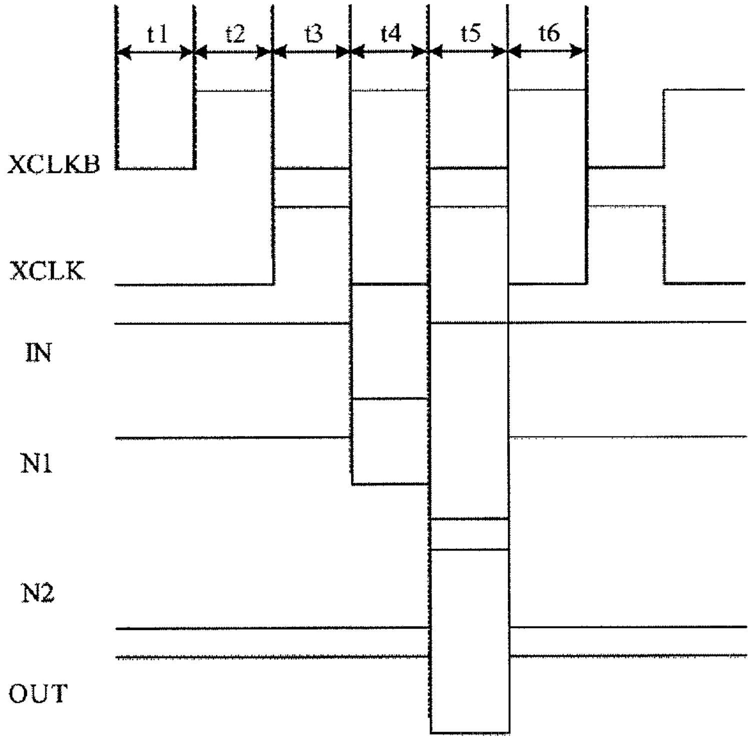
FIG. 6 is a schematic diagram of the operating timing of the third embodiment of the shift register unit provided by the present disclosure.

FIG. 6 is the schematic diagram of the operating timing of the third embodiment of the shift register unit provided by the present disclosure. As shown in FIG. 6, in this embodiment, the input signals of the shift register unit are a first clock signal XCLKB and a second clock signal XCLK, which are input into the first clock signal input terminal (CLKB) and the second clock signal input terminal (CLK), respectively. The two clock signals have a duty ratio of 50%, and their phases are opposite to each other. The phases of the clock signals of two adjacent shift register units are opposite to each other in the embodiment. That is to say, if the first clock signal input terminal (CLKB) of one shift register unit is inputted with an external first clock signal XCLKB, and its second clock signal input terminal (CLK) is inputted with an external second clock signal XCLK, then the first clock signal input terminal (CLKB) of the previous shift register unit adjacent to the one shift register unit is inputted with the external second clock signal XCLK, and its second clock signal terminal (CLK) is inputted with the external first clock signal XCLKB. Also, the first clock signal input terminal (CLKB) of the next shift register unit adjacent to the one shift register unit is inputted with the external second clock signal XCLK, and its second clock signal terminal (CLK) is inputted with the external first clock signal XCLKB. A high voltage signal VDD is inputted into the high voltage signal input terminal (VDD) of the shift register units, a low voltage signal VSS is inputted into the low voltage signal input terminal (VSS) of the shift register units, a frame start signal STV is inputted into the initial signal input terminal (IN) of the first shift register unit, and the initial signal input terminals (IN) of all other shift register units are inputted with the output signals from the output terminals (OUT) of the respective previous shift register units adjacent to them.

Further, the shift register unit provided by the embodiment may comprise respective backup TFTs for those TFTs. That is to say, the first TFT M1, the second TFT M2, the third TFT M3, the fourth TFT M4, and the fifth TFT M5 are respectively provided with corresponding backup TFTs, and the connection of the respective backup TFTs is the same as that of the corresponding TFTs. In other words, in the shift register unit, there may be arranged a corresponding backup TFT M1 with the same connection as the first TFT M1, i.e. the gate of M1' being connected to the second clock signal input terminal, and the source of M1' being connected to the initial signal input terminal: there maybe arranged a corresponding backup TFT M2' with the same connection as the second TFT M2, i.e. the source of MT being connected to the output terminal of the output module, and the drain of M2' being connected to the first clock signal input terminal; there may be arranged a corresponding backup TFT M3' with the same connection as the third TFT M3, i.e. the gate and the source of M3' being both connected to the second clock signal input terminal: there maybe arranged a corresponding backup TFT M4' with the same connection as the fourth TFT M4, i.e. the source of M4' being connected to the output terminal of the output module, and the drain of the M4' is connected to the high voltage input terminal; and there may be arranged a corresponding backup TFT M5' with the same connection as the fifth TFT M5, i.e. the source of M5' being connected to the second clock signal input terminal.

Further, the shift register unit provided by the embodiment may comprise a charging capacitor C, one end of which is connected to the first node N1, and the other end of which is connected to the output terminal (OUT). When the size of the TFT M2 is large enough, since Cgd may remain the voltage of the first node N1 during one period, the function of the charging capacitor C in this embodiment can be realized by the parasitic capacitance Cgd inherent to the TFT M2, which further saves the area of the shift register unit.

It is noted that the first TFT M1, the second TFT M2, the third TFT M3, the fourth TFT M4, and the fifth TFT M5 in the embodiment can all be realized by P-type transistors turned on by a low level or N-type transistors turned on by a high level. In this embodiment, the P-type transistor is taken as an example to make the description.

Referring to FIG. 5 and FIG. 6 again, TFTs M1-M5 of the shift register unit in the embodiment are all turned on by the low level and turned off by the high level. Here, a description is made with the first shift register unit as an example. The first clock signal input terminal (CLKB) of the shift register unit is inputted with the first clock signal XCLKB, its second clock signal input terminal (CLK) is inputted with the second clock signal XCLK, and its initial signal input terminal (IN) is inputted with the frame start signal STV.

In the initial state, the signals inputted into the first clock signal input terminal (CLKB) and the second clock signal input terminal (CLK) are both in the low level, while the signal inputted into the initial signal input terminal (IN) is in the high level. During the period of t1, the first TFT M1 is turned on by the low level of the second clock signal input terminal (CLK), and the initial signal input terminal (IN) is in the high level, whereby the first node N1 is charged to the high level. The high level of the first node N1 turns off the second TFT M2 and the fifth TFT M5, making the second node N2 floating. The third TFT M3 is turned on by the low level of the first clock signal input terminal (CLKB), which electrically connects the second node N2 to the second clock signal input terminal (CLK), and makes the second node N2 change from floating to the low level. The fourth TFT M4 is turned on by the low level of the second node N2, and the output terminal (OUT) are charged by the high voltage signal input terminal (VDD) to the high level. Therefore, during the period of t1, the TFTs M1, M3, and M4 are in ON state, while the TFTs M2 and M5 are in OFF state. The internal node N1 is in the high level, the internal node N2 is in the low level, and the output is the high level. Because the TFT M2 is in OFF state, the DC path from VDD to CLKB through M4 and M2 is eliminated.

During the period of t2, the first clock signal input terminal (CLKB) is inputted with a signal in high level, the second clock signal input terminal (CLK) is inputted with a signal in low level, and the initial signal input terminal (IN) is in the high level. The first TFT M1 is turned on by the low level of the second clock signal input terminal (CLK), and the initial signal input terminal (IN) is in the high level, whereby the first node N1 is charged to the high level. The high level of the first node N1 turns off the second TFT M2 and the fifth TFT M5. The third TFT M3 is also turned on by the low level of the second clock signal input terminal (CLK), which in turn electrically connects the second node N2 with the second clock signal input terminal, and makes the second node N2 at the low level. The fourth TFT M4 is then turned on by the low level of the second node N2, and the output terminal (OUT) are charged by the high voltage signal input terminal (VDD) to the high level. Therefore, during the period of t2, the TFTs M1, M3, and M4 are in ON state, while the TFTs M2 and M5 are in OFF state. The internal node N1 is in the high level, the internal node N2 is in the low level, and the output is the high level. Because the CLKB is in the high level, and the TFT M2 is in OFF state, the DC path from VDD to CLKB through M4 and M2 is eliminated as well.

During the period of t3, the first clock signal input terminal (CLKB) is inputted with a signal in low level, the second clock signal input terminal (CLK) is inputted with a signal in high level, and the initial signal input terminal (IN) is in the high level. The first TFT M1 and the third TFT M3 are turned off by the high level of the second clock signal input terminal (CLK). Thus the first node N1 still remains at the high level, and the second node N2 still remains at the low level. The high level of the first node N1 turns off the second TFT M2 and the fifth TFT M5. The low level of the second node N2 turns on the fourth TFT M4, and then the output terminal (OUT) remains at the high level. Therefore, during the period of t3, the TFT M4 is in ON state, while the TFTs M1. M2. M3, and M5 are in OFF state. The internal node N1 is in the high level, the internal node N2 is in the low level, and the output is the high level. Because the TFT M2 is in OFF state, the DC path from VDD to CLKB through M4 and M2 is eliminated.

During the period of t4, the first clock signal input terminal (CLKB) is inputted with a signal in high level, the second clock signal input terminal (CLK) is inputted with a signal in the low level, and the initial signal input terminal (IN) is in the low level. This period is the pre-charging period of the shift register unit. The low level of the second clock signal input terminal (CLK) turns on the first TFT M1 and the third TFT M3, thus the low level of the initial signal input terminal (IN) is transferred to the first node N1, which charges the charging capacitor C, turns on the TFT M2, and then the high level is transferred to the output terminal. Meanwhile, the low level of the first node N1 turns on the fifth TFT M5, which connects the second node N2 with the second clock signal input terminal (CLK), whereby the second node N2 remains at the low level due to the low level of the second clock signal input terminal (CLK). The low level of the second node N2 turns on the fourth TFT M4, which then transfers the high level to the output terminal (OUT). Therefore, during the period of t4, the TFTs M1, M2, M3, M4, and M5 are all in ON state. The internal nodes N1 and N2 are both in the low level, and the output is the high level. Because CLKB is in the high level, the DC path from VDD to CLKB through M2 and M4 is eliminated as well.

During the period of t5, the first clock signal input terminal (CLKB) is inputted with a signal in the low level, the second clock signal input terminal (CLK) is inputted with a signal in high level, and the initial signal input terminal (IN) is in the high level. This period is the evaluation period of the shift register unit. The high level of the second clock signal input terminal (CLK) turns off the first TFT M1 and the third TFT M3, resulting in the floating of the first node N1. The potential difference between the two ends of the charging capacitor C formed during the pre-charging period makes the voltage of the first node N1 decrease, which terminates the floating state of N1, and thus turns on the second TFT M2 and the fifth TFT M5. Due to the bootstrap effect of the capacitor, the decreased voltage of N1 is lower than the low level of the power supply voltage, i.e. lower than the low level of CLK, and is around VSS-VDD. After the fifth TFT M5 is turned on, the voltage of its parasitic capacitance is VSS-2VDD, and a large ON current is generated, which accelerates the voltage of second node N2 to increase to the high level. The high level of the second node N2 then turns off the fourth TFT M4, making the low level of the first clock signal input terminal (CLKB) be transferred to the output terminal (OUT) quickly. Therefore, during the period of t5, the TFTs M2 and M5 are in ON state, while the TFTs M1, M3, and M4 are in OFF state. The internal node N1 is in the low level, the internal node N2 is in the high level, and the output is the low level. Because the TFT M4 is in OFF state, the DC path from VDD to CLKB through M2 and M4 is eliminated as well.

During the period of t6, the first clock signal input terminal (CLKB) is inputted with a signal in high level, the second clock signal input terminal (CLK) is inputted with a signal in low level, and the initial signal input terminal (IN) is in the high level. This period is the reset period of the shift register unit. The low level of the second clock signal input terminal (CLK) turns on the first TFT M1 and the third TFT M3, thus the high level of the initial signal input terminal (IN) is transferred to the first node N1, which turns off the second TFT M2 and the fifth TFT M5. After the third TFT M3 is turned on, the second node N2 remains at the low level due to the low level of the second clock signal input terminal (CLK). The low level of the second node N2 turns on the fourth TFT M4, which then transfers the high level to the output terminal (OUT). Therefore, during the period of t6, the TFTs M1, M3, and M4 are in ON state, while the TFTs M2 and M5 are in OFF state. The internal node N1 is in the high level, the internal node N2 is in the low level, and the output is the high level. Because the TFT M2 is in OFF state, the DC path from VDD to CLKB through M2 and M4 is eliminated as well.

Figure 7:
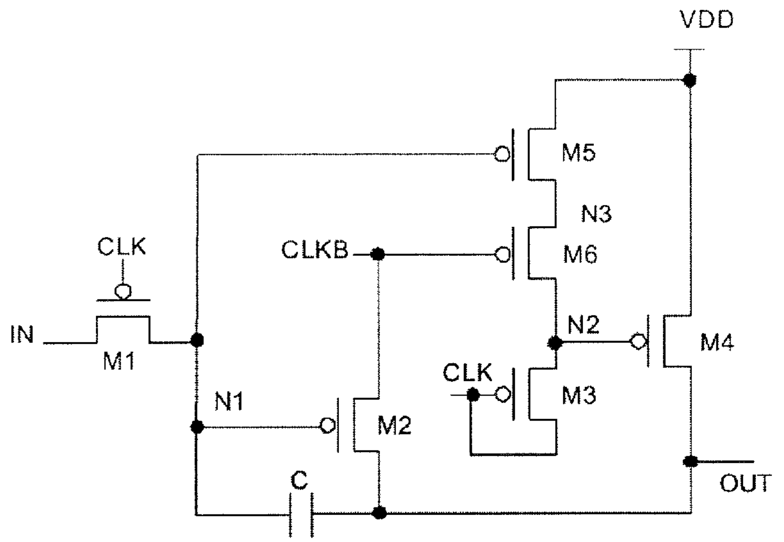
FIG. 7 is a schematic structure of a fourth embodiment of the shift register unit provided by the present disclosure.

FIG. 7 is a schematic structure of the fourth embodiment of the shift register unit provided by the present disclosure. As shown in FIG. 7, the shift register unit provided by the embodiment may have the input module, the output module, and the gate drive signal generation unit similar to that in the third embodiment described above, on the basis of the second embodiment. Those similar parts will not be discussed here.

As shown in FIG. 7, the feedback control unit of the shift register unit provided in the embodiment may specifically comprises a first TFT M1, a third TFT M3, a fifth TFT M5, and a sixth TFT M6. The gate of the first TFT M1 is connected to the second clock signal input terminal (CLK), and the source of the first TFT M1 is connected to the initial signal input terminal (IN). The gate and the source of the third TFT M3 are both connected to the second clock signal input terminal (CLK). The drain of the fifth TFT M5 is connected to the high voltage signal input terminal (VDD). The gate of the sixth TFT M6 is connected to the first clock signal input terminal (CLKB).

Further, as shown in FIG. 7, in the embodiment, the drain of the first TFT M1, the gate of the second TFT M2, the gate of the fifth TFT M5 are connected together to form the first node N1. The drain of the third TFT M3, the gate of the fourth TFT M4, and the source of the sixth TFT M6 are connected together to form the second node N2. The source of the fifth TFT M5 and the drain of the sixth TFT M6 are connected together to form the third node N3.

Figure 8:
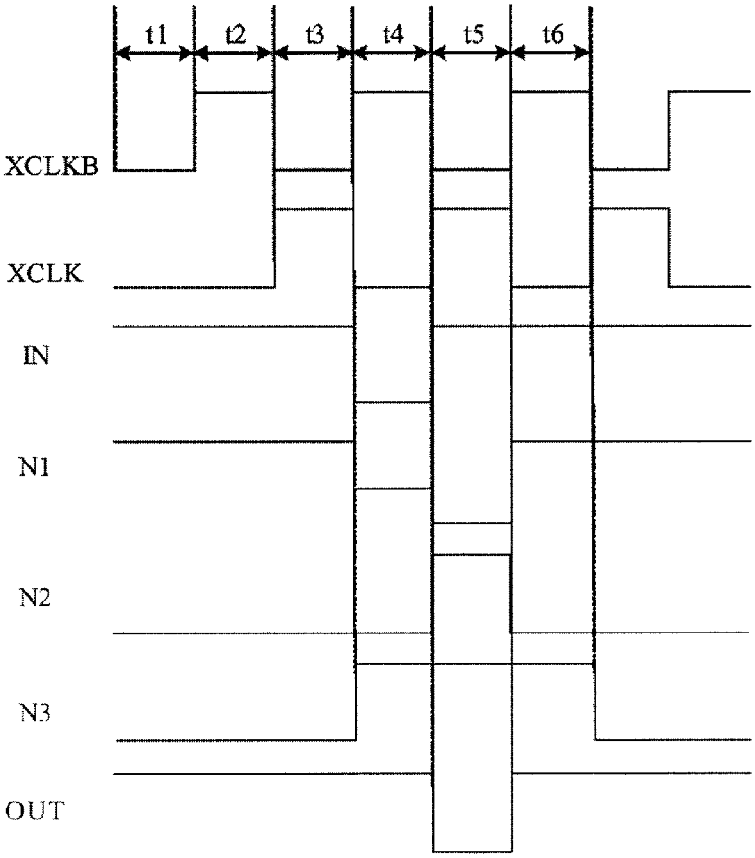
FIG. 8 is a schematic diagram of the operating timing of the fourth embodiment of the shift register unit provided by the present disclosure.

FIG. 8 is the schematic diagram of the operating timing of the fourth embodiment of the shift register unit provided by the present disclosure. As shown in FIG. 8, in this embodiment, the input signals of the shift register unit are a first clock signal XCLKB and a second clock signal XCLK, which are input into the first clock signal input terminal (CLKB) and the second clock signal input terminal (CLK), respectively. The two clock signals have a duty ratio of 50%, and their phases are opposite to each other. The phases of the clock signals of two adjacent shill registers are opposite to each other in the embodiment. That is to say, if the first clock signal input terminal (CLKB) of one shift register unit is inputted with an external first clock signal XCLKB, and its second clock signal input terminal (CLK) is inputted with an external second clock signal XCLK, then the first clock signal input terminal (CLKB) of the previous shift register unit adjacent to the one shift register unit is inputted with the external second clock signal XCLK, and its second clock signal terminal (CLK) is inputted with the external first clock signal XCLKB. Also, the first clock signal input terminal (CLKB) of the next shill register unit adjacent to the one shift register unit is inputted with the external second clock signal XCLK, and its second clock signal terminal (CLK) is inputted with the external first clock signal XCLKB. A high voltage signal VDD is inputted into the high voltage signal input terminal (VDD) of the shift register units, a low voltage signal VSS is inputted into the low voltage signal input terminal (VSS) of the shift register units, a frame start signal STV is inputted into the initial signal input terminal (IN) of the first shill register unit, and the initial signal input terminals (IN) of all other shift register units are inputted with the output signals from the output terminals (OUT) of the respective previous shift register units adjacent to them.

Further, the shift register unit provided by the embodiment may comprise respective backup TFTs for those TFTs. In other words, the first TFT M1, the second TFT M2, the third TFT M3, the fourth TFT M4, the fifth TFT M5, and the sixth TFT M6 are respectively provided with corresponding backup TFTs, and the connection of the respective backup TFTs is the same as that of the corresponding TFTs. That is, in the shift register unit, there may be arranged a corresponding backup TFT M1' with the same connection as the first TFT M1, i.e. the gate of M1' being connected to the second clock signal input terminal, and the source of M1' being connected to the initial signal input terminal; there may be arranged a corresponding backup TFT M2' with the same connection as the second TFT M2, i.e. the source of M2' being connected to the output terminal of the output module, and the drain of M2' being connected to the first clock signal input terminal; there may be arranged a corresponding backup TFT M3' with the same connection as the third TFT M3, i.e. the gate and the source of M3' being both connected to the second clock signal input terminal; there maybe arranged a corresponding backup TFT M4' with the same connection as the fourth TFT M4, i.e. the source of M4' being connected to the output terminal of the output module, and the drain of the M4' is connected to the high voltage input terminal; there may be arranged a corresponding backup TFT M5' with the same connection as the fifth TFT M5, i.e. the drain of M5' being connected to the high voltage signal input terminal; and there may be arranged a corresponding backup TFT M6' with the same connection as the sixth TFT M6, i.e. the gate of M6' being connected to the first clock signal input terminal.

Further, the shift register unit provided by the embodiment may comprise a charging capacitor C, one end of which is connected to the first node N1, and the other end of which is connected to the output terminal (OUT). When the size of the TFT M2 is large enough, since Cgd may remain the voltage of the first node N1 during one period, the function of the charging capacitor C in this embodiment can be realized by the parasitic capacitance Cgd inherent to the TFT M2, which further saves the area of the shift register.

It is noted that the first TFT M1 the second TFT M2, the third TFT M3, the fourth TFT M4, the fifth TFT M5, and the sixth TFT M6 in the embodiment can all be realized by P-type transistors turned on by a low level or N-type transistors turned on by a high level. In this embodiment, the P-type transistor is taken as an example to make the description.

Referring to FIG. 7 and FIG. 8 again, the TFTs M1-M6 of the shift register unit in the embodiment are all turned on by the low level and turned off by the high level. Here, a description is made with the first shift register unit as an example. The first clock signal input terminal (CLKB) of the shift register unit is inputted with the first clock signal XCLKB, its second clock signal input terminal (CLK) is inputted with the second clock signal XCLK, and its initial signal input terminal (IN) is inputted with the frame start signal STV.

In the initial state, the signals inputted into the first clock signal input terminal (CLKB) and the second clock signal input terminal (CLK) are both in the low level, while the signal inputted into the initial signal input terminal (IN) is in the high level. During the period of t1, the TFTs M1, M3, M4, and M6 are in ON state, while the TFTs M2 and M5 are in OFF state. The internal node N1 is in the high level, the internal nodes N2 and N3 are in the low level, and the output is the high level. Because the TFT M2 is in OFF state, the DC path from VDD to CLKB through M4 and M2 is eliminated. Because the TFT M5 is in OFF state, the DC path from VDD to CLK through M5, M6, and M3 is eliminated.

During the period of t2, the first clock signal input terminal (CLKB) is inputted with a signal in high level, the second clock signal input terminal (CLK) is inputted with a signal in low level, and the initial signal input terminal (IN) is in the high level. Therefore, during the period of t2, the TFTs M1. M3, and M4 are in ON state, while the TFTs M2, M5, and M6 are in OFF state. The internal node N1 is in the high level, the internal nodes N2 and N3 are in the low level, and the output is the high level. Because the CLKB is in the high level, and the TFT M2 is in OFF state, the DC path from VDD to CLKB through M4 and M2 is eliminated. Because the TFTs M5 and M6 are in OFF state, the DC path from VDD to CLK through M5, M6, and M3 is eliminated.

During the period of t3, the first clock signal input terminal (CLKB) is inputted with a signal in low level, the second clock signal input terminal (CLK) is inputted with a signal in high level, and the initial signal input terminal (IN) is in the high level. Therefore, during the period of t3, the TFTs M4 and M6 are in ON state, while the TFTs M1, M2, M3, and M5 are in OFF state. The internal node N1 is in the high level, the internal nodes N2 and N3 are in the low level, and the output is the high level. Because the TFT M2 is in OFF state, the DC path from VDD to CLKB through M4 and M2 is eliminated.

Because CLK is in the high level, and the TFTs M3 and M5 are in OFF state, the DC path from VDD to CLK through M5, M6, and M3 is eliminated.

During the period of t4, the first clock signal input terminal (CLKB) is inputted with a signal in high level, the second clock signal input terminal (CLK) is inputted with a signal in the low level, and the initial signal input terminal (IN) is in the low level. This period is the pre-charging period of the shift register unit. The low level of the second clock signal input terminal (CLK) turns on the first TFT M1 and the third TFT M3, thus under effect of the low level of the initial signal input terminal (IN), the low level is transferred to the first node N1, which charges the charging capacitor C. At this point, the TFT M2 is also turned on, and the high level is transferred to the output terminal (OUT). Meanwhile, the low level of the first node N1 turns on the fifth TFT M5, which connects the third node N3 with the second clock input terminal (CLK), whereby the third node N3 becomes the high level due to the high level of the high level signal input terminal (VDD). The sixth TFT M6 is turned off by the high level of the first clock signal input terminal (CLKB). The turning on of the third TFT M3 pulls down the voltage of the second node N2, which turns on the fourth TFT M4, which transfers the high level to the output terminal (OUT). Therefore, during the period of t4, the TFTs M1. M2, M3, M4, and M5 are all in ON state, while the TFT M6 is in OFF state. The internal nodes N1 and N2 are both in the low level. N3 is in the high level, and the output is the high level. Because CLKB is in the high level, the DC path from VDD to CLKB through M2 and M4 is eliminated as well. Because the TFT M6 is in OFF state, the DC path from VDD to CLK through M5, M6, and M3 is eliminated.

During the period of t5, the first clock signal input terminal (CLKB) is inputted with a signal in the low level, the second clock signal input terminal (CLK) is inputted with a signal in high level, and the initial signal input terminal (IN) is in the high level. This period is the evaluation period of the shift register unit. The high level of the second clock signal input terminal (CLK) turns off the first TFT M1 and the third TFT M3, resulting in the floating of the first node N1. The potential difference between the two ends of the charging capacitor C formed during the pre-charging period makes the voltage of the first node N1 decrease, which terminates the floating state of N1, and thus turns on the second TFT M2 and the fifth TFT M5. Due to the bootstrap effect of the capacitor, the decreased voltage of N1 is lower than the low level of the power supply voltage, i.e. lower than the low level of CLK, and is around VSS-VDD. The low level of the first clock signal input terminal (CLKB) turns on the sixth TFT M6. After the fifth TFT M5 is turned on, the voltage of its parasitic capacitance is VSS-2VDD, and a large ON current is generated, which accelerates the voltage of second node N2 to increase to the high level. The high level of the second node N2 then turns off the fourth TFT M4, making the low level of the first clock signal input terminal (CLKB) be transferred to the output terminal (OUT) quickly. Therefore, during the period of t5, the TFTs M2, M5, and M6 are in ON state, while the TFTs M1, M3, and M4 are in OFF state. The internal node N1 is in the low level, the internal nodes N2 and N3 are in the high level, and the output is the low level. Because the TFT M4 is in OFF state, the DC path from VDD to CLKB through M2 and M4 is eliminated as well. Because CLK is in the high level, and the TFT M3 is in OFF state, the DC path from VDD to CLK through M5, M6, and M3 is eliminated.

During the period of t6, the first clock signal input terminal (CLKB) is inputted with a signal in high level, the second clock signal input terminal (CLK) is inputted with a signal in low level, and the initial signal input terminal (IN) is in the high level. This period is the reset period of the shift register unit. The low level of the second clock signal input terminal (CLK) turns on the first TFT M1 and the third TFT M3, thus the high level of the initial signal input terminal (IN) is transferred to the first node N1, which turns off the second TFT M2 and the fifth TFT M5. The sixth TFT M6 is turned off by the high level of the first signal input terminal (CLKB). After the third TFT M3 is turned on, the second node N2 remains at the low level due to the low level of the second clock signal input terminal (CLK). The low level of the second node N2 turns on the fourth TFT M4, which transfers the high level to the output terminal (OUT). Therefore, during the period of t6, the TFTs M1, M3, and M4 are in ON state, while the TFTs M2. M5, and M6 are in OFF state. The internal node N1 is in the high level, the internal node N2 is in the low level, and the output is the high level. Because CLKB is in high level, and the TFT M2 is in the OFF state, the DC path from VDD to VSS through M2 and M4 is eliminated as well. Because the TFTs M5 and M6 are in OFF state, the DC path from VDD to CLK through M5, M6, and M3 is eliminated.

Figure 9:
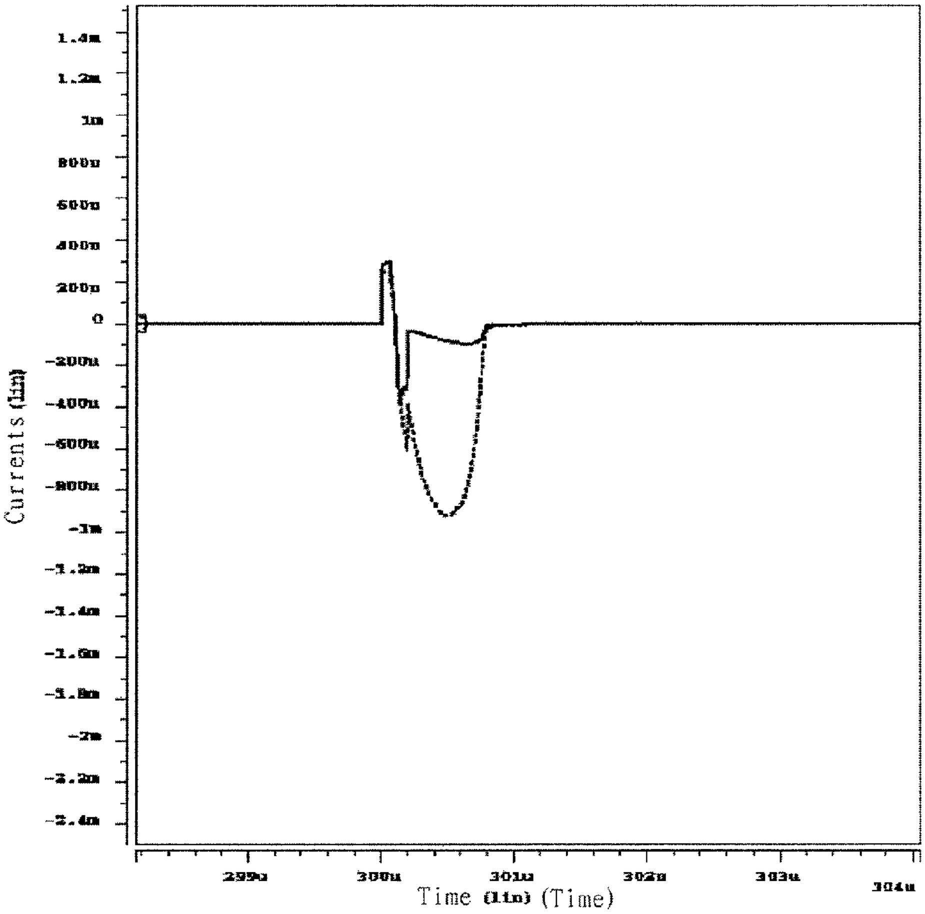
FIG. 9 is a schematic diagram of the simulated experimental result of the transient current generated during the evaluation period in the fourth embodiment of the shift register unit provided by the present disclosure.
Figure 10:
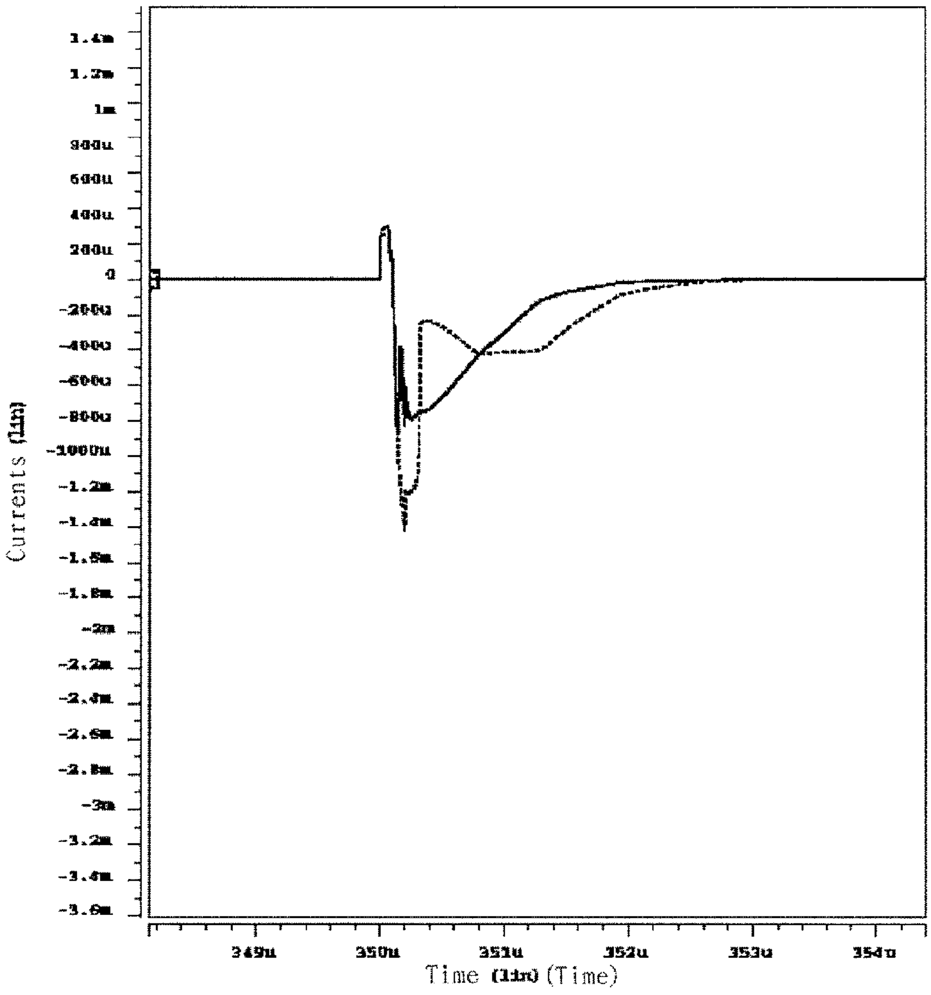
FIG. 10 is a schematic diagram of the simulated experimental result of the transient current generated during the period of reset in the fourth embodiment of the shift register unit provided by the present disclosure

FIG. 9 and FIG. 10 are the simulated experimental results of the transient currents generated during the evaluation period and the reset period in the fourth embodiment of the shift register unit provided by the present disclosure, respectively, wherein, the dashed lines represent the transient currents generated by the shift register unit in the prior art, and the solid lines represent the transient currents generated by the shift register unit in the embodiment. It can be seen that the transient current of the shift register unit provided by the embodiment is much smaller than that in the prior art, for both the evaluation period and the reset period. By comparison of the simulated experimental results, to drive an active OLED pixel matrix of 240×320 (RGB), the average consumed current by employing the structure of the shift register unit of the embodiment is around 25.2 μA per frame, while the average consumed current by employing the structure of the shift register unit of the prior art is around 35.5 μA per frame. Therefore, 25% of the average power consumption can be saved by the present disclosure, compared with the prior art.

In the embodiment, by changing the structure of the shift register unit, i.e. by controlling the first node N1 driving the second TFT M2 and the second node N2 driving the fourth TFT M5 to make the voltage of the first node N1 generated during the evaluation period of the shift register unit lower than the low level of the power supply voltage, and then turn on the fifth TFT M5, control the level of the second node N2 to rise to turn off the fourth TFT M4 in time, so that the voltage of the internal nodes to be reset quickly to cut off the transient current of the DC path, the generation of the transient current due to that the feedback is created by the voltage change of the output terminal in the prior art can be avoided. Meanwhile, in the embodiment, the source of M5 is connected to VDD instead of CLK, and M6, which operates mainly to block the transient leaking current through M5 and M3 from VDD, is added to further reduce the power consumption of the shift register unit, on the basis of the third embodiment.

Figure 11:
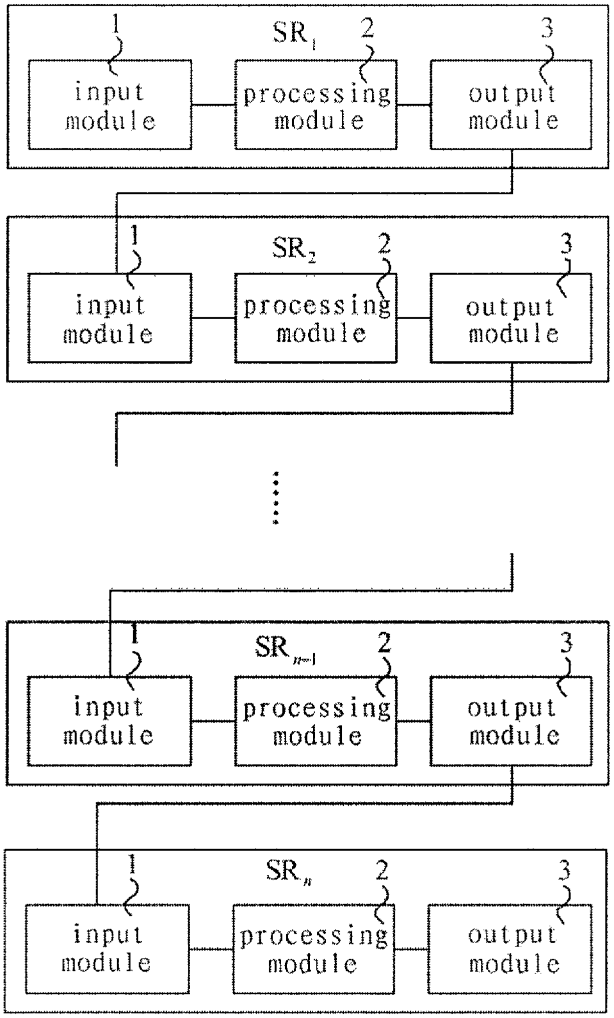
FIG. 11 is a schematic structure of a first embodiment of the gate drive circuit provided by the present disclosure.

FIG. 11 is the schematic structure of the first embodiment of the gate drive circuit provided by the present disclosure. As shown in FIG. 11, the embodiment provides a gate drive circuit, which may comprise n shift register units connected in sequence, wherein n is a positive integer. Each shift register unit in the embodiment can adopt any shift register unit described in the embodiments of FIG. 3, FIG. 4, FIG. 5, or FIG. 7. The output module 3 of the ith shift register unit SRi is connected to the input module 1 of the i+1th shift register unit to input the gate drive signal outputted from the ith shift register unit into the i+1th shift register unit as the frame start signal of the i+1 th shift register unit, wherein i∈[1, n) and i is a positive integer. Moreover, if the first clock signal input terminal of one shift register unit is inputted with the first clock signal, and its second clock signal input terminal is inputted with the second clock signal, then the first clock signal input terminals of the previous and the next shift register units adjacent to the one shift register unit are both inputted with the second clock signal, and the second clock signal input terminals of the previous and the next shift register units adjacent to the one shift register unit are both inputted with the first clock signal. The input module of the first shift register unit out of the n shift register units is coupled with the frame start input signal from the external.

Figure 12:
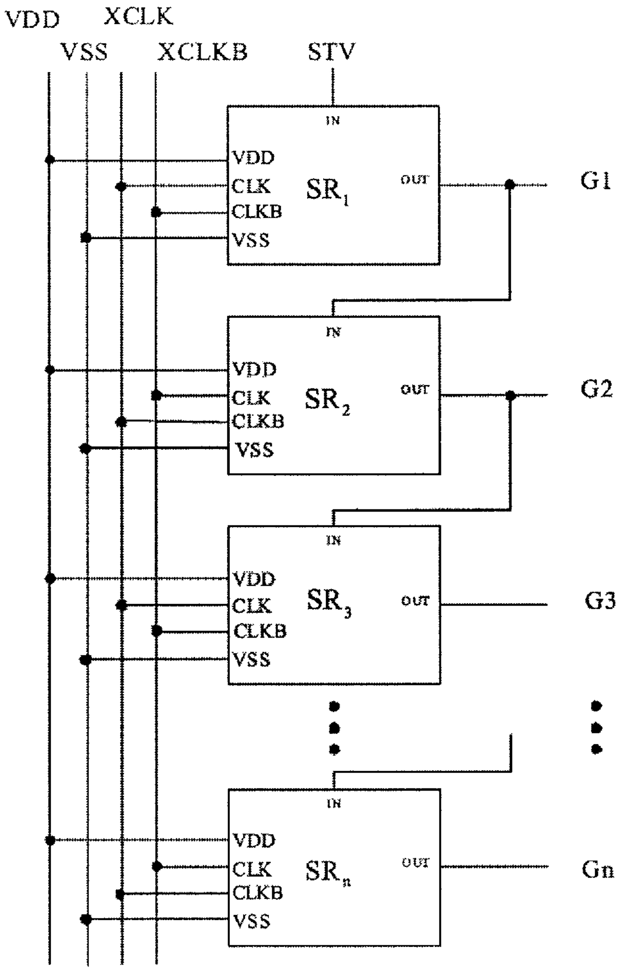
FIG. 12 is a schematic structure of a second embodiment of the gate drive circuit provided by the present disclosure.

FIG. 12 is the schematic structure of the second embodiment of the gate drive circuit provided by the present disclosure. As shown in FIG. 12, the embodiment provides a specific gate drive circuit, which may also comprise n shift register units connected in sequence, wherein n is a positive integer. Each shift register unit in the embodiment can adopt any shift register unit described in the embodiments of FIG. 3. FIG. 4, FIG. 5, or FIG. 7. The high voltage signal input terminal (VDD) of each shift register unit is coupled with the high voltage signal VDD provided from the external, and the low voltage signal input terminal (VSS) of each shift register unit is coupled with the low voltage signal VSS provided from the external.

The first clock signal input terminal (CLKB) of the first shift register unit SR1 is coupled with the first clock signal XCLKB provided from the external, and the second clock signal input terminal (CLK) of the first shift register unit SR1 is coupled with the second clock signal XCLK provided from the external. The first clock signal input terminal (CLKB) of the second shift register unit SR2 is coupled with the second clock signal XCLK provided from the external, and the second clock signal input terminal (CLK) of the second shill register unit SR2 is coupled with the first clock signal XCLKB provided from the external. The first clock signal input terminal (CLKB) of the third shill register unit SR3 is coupled with the first clock signal XCLKB provided from the external, and the second clock signal input terminal (CLK) of the third shift register unit SR3 is coupled with the second clock signal XCLK provided from the external. Similarly, when j is an odd number, the first clock signal input terminal (CLKB) of the jth shift register unit SRj is coupled with the first clock signal XCLKB provided from the external, and the second clock signal input terminal (CLK) of the jth shift register, unit SRj is coupled with the second clock signal XCLK provided from the external. When j is an even number, The first clock signal input terminal (CLKB) of the jth shift register unit SRj is coupled with the second clock signal XCLK provided from the external, and the second clock signal input terminal (CLK) of the jth shift register unit SRj is coupled with the first clock signal XCLKB provided from the external. However, if the first clock signal input terminal (CLKB) of the first shift register unit SR1 is coupled with the second clock signal XCLK provided from the external, and the second clock signal input terminal (CLK) of the first shift register unit SR1 is coupled with the first clock signal XCLK provided from the external, then the connection of the input terminals (CLKB and CLK) of the subsequent shift register units is opposite to that described above.

The initial signal input terminal (IN) of the first shift register unit is coupled with the frame start input signal STV provided from the external. The output terminal (OUT) of the output module of the first shift register unit is connected to the initial signal input terminal (IN) of the input module of the second shift register unit to input the gate drive signal output from the first shift register unit into the second shift register unit as the frame start signal of the second shift register unit. The output terminal (OUT) of the output module of the second shift register unit is connected to the initial signal input terminal (IN) of the input module of the third shift register unit to input the gate drive signal output from the second shill register unit into the third shill register unit as the frame start signal of the third shift register unit. Similarly, the output module of the ith shift register unit is connected to the input module of the i+1th shift register unit to input the gate drive signal output from the ith shift register unit into the i+1th shift register unit as the frame start signal of the i+1th shift register unit, wherein, i∈[1, n) and i is a positive integer. The output terminal (OUT) of the output module of the n−1th shift register unit is connected to the initial signal input terminal (IN) of the input module of the nth shift register unit to input the gate drive signal output from the n−1th shift register unit into the nth shift register unit as the frame start signal of the nth shift register unit.

Figure 13:
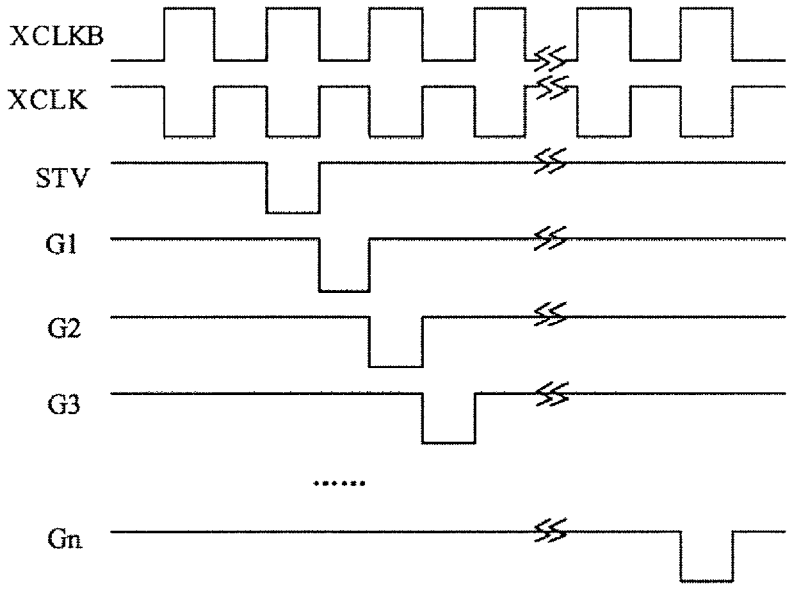
FIG. 13 is a schematic diagram of the operating timing of the second embodiment of the gate drive circuit provided by the present disclosure.

FIG. 13 is the schematic diagram of the operating timing of the second embodiment of the gate drive circuit provided by the present disclosure. As shown in FIG. 13, the operating process of each shift register unit in the gate drive circuit provided by the embodiment is similar to the operation process of the shift register unit shown in FIG. 5 or FIG. 7, and they will not be discussed here.

The present disclosure further provides a display apparatus, which can comprise the gate drive circuits shown in FIG. 11 or FIG. 12.

Finally, it should be noted that the above-mentioned embodiments are only for illustrating the technical solutions of the present disclosure, but not intended to limit the disclosure. Although the disclosure has been described in detail with reference to the above-mentioned embodiments, those skilled in the art should understand that the technical solutions recorded in the above-mentioned embodiments can be modified, or a part of their technical features can be replaced by equivalents thereof, and the modifications and replacements do not depart from the spirit and scope of the technical solution of each embodiment of the disclosure.

What is claimed is:

1. A shift register unit, comprising:

an input module which inputs a first clock signal, a second clock signal, a frame start signal, a high voltage signal, and a low voltage signal, wherein the first clock signal is identical with the phase-inverted signal of the second clock signal within time interval of one frame;

a processing module comprising a plurality of thin film transistors and connected to the input module, which generates a gate drive signal according to the first clock signal, the second clock signal, and the frame start signal, controls the voltage of a first node formed by the thin film transistors lower than the low level of a power supply signal during an evaluation period of the shift register unit, and controls to reset a second node formed by the thin film transistors, so as to cut off a transient direct current path formed by the input terminal of the high voltage signal, the input terminal of the low voltage signal, and at least one thin film transistor in time; and an output module connected with the processing module, which sends the gate drive signal generated by the processing module, wherein the processing module comprises:

a gate drive signal generation unit connected with the input module and comprising at least an evaluation thin film transistor and a reset thin film transistor, which generates the gate drive signal according to the first clock signal, the second clock signal, and the frame start signal, wherein the ON and OFF of the evaluation thin film transistor is driven by the first node, and the ON and OFF of the reset thin film transistor is driven by the second node;

a feedback control unit connected with the gate drive signal generation unit, which controls to make the voltage of a first node formed by the thin film transistors lower than the low level of the power supply signal during the evaluation period of the shift register unit, and controlling to reset the second node formed by the thin film transistors, so as to cut off the transient direct current path formed by the input terminal of the high voltage signal, at least one thin film transistor, and the input terminal of the low voltage signal in time.

2. The shift register unit according to claim 1, wherein the input module comprises:

an initial signal input terminal which inputs the frame start signal;

a first clock signal input terminal which inputs the first clock signal or the second clock signal;

a second clock signal input terminal which inputs the second clock signal or the first clock signal;

a high voltage signal input terminal which inputs the high voltage signal; and a low voltage signal input terminal which inputs the low voltage signal.

3. The shift register unit according to claim 2, wherein the output module comprises:

an output terminal which sends the gate drive signal generated by the processing module and inputs the gate drive signal into the initial signal input terminal of the next shift register unit.

4. The shift register unit according to claim 3, wherein the gate drive signal generation unit comprises:

a second thin film transistor which is the evaluation thin film transistor, and its source is connected to the output terminal of the output module and its drain is connected to the first clock signal input terminal;

a fourth thin film transistor which is the reset thin film transistor, and its source is connected to the output terminal of the output module and its drain is connected to the high voltage signal input terminal.

5. The shift register unit according to claim 4, wherein the feedback control unit comprises:

a first thin film transistor, the gate of which is connected to the second clock signal input terminal, and the source of which is connected to the initial signal input terminal;

a third thin film transistor, the gate and the source of which are both connected to the second clock signal input terminal;

a fifth thin film transistor, the drain of which is connected to the second clock signal input terminal, wherein the drain of the first thin film transistor, the gate of the second thin film transistor, and the gate of the fifth thin film transistor are connected together to form the first node, and the drain of the third thin film transistor, the gate of the fourth thin film transistor, and the source of the fifth thin film transistor are connected together to form the second node.

6. The shift register unit according to claim 5, wherein the first thin film transistor, the second thin film transistor, the third thin film transistor, the fourth thin film transistor, and the fifth thin film transistor are respectively provided with corresponding backup thin film transistors, and the connections of the respective backup thin film transistors are the same as those of the corresponding thin film transistors.

7. The shift register unit according to claim 6, wherein the first thin film transistor, the second thin film transistor, the third thin film transistor, the fourth thin film transistor, and the fifth thin film transistor all are P-type transistors or N-type transistors.

8. The shift register unit according to claim 6, further comprising a charging capacitor, one end of which is connected to the first node, and the other end of which is connected to the output terminal.

9. The shift register unit according to claim 5, further comprising a charging capacitor, one end of which is connected to the first node, and the other end of which is connected to the output terminal.

10. The shift register unit according to claim 5, wherein the first thin film transistor, the second thin film transistor, the third thin film transistor, the fourth thin film transistor, and the fifth thin film transistor all are P-type transistors or N-type transistors.

11. The shift register unit according to claim 4, wherein the feedback control unit comprises:

a first thin film transistor, the gate of which is connected to the second clock signal input terminal, and the source of which is connected to the initial signal input terminal;

a third thin film transistor, the gate and the source of which are both connected to the second clock signal input terminal;

a fifth thin film transistor, the drain of which is connected to the high voltage signal input terminal;

a sixth thin film transistor, the gate of which is connected to the first clock signal input terminal;

wherein, the drain of the first thin film transistor, the gate of the second thin film transistor, the gate of the fifth thin film transistor are connected together to form the first node, and the drain of the third thin film transistor, the gate of the fourth thin film transistor, the source of the sixth thin film transistor are connected together to form the second node, and the source of the fifth thin film transistor and the drain of the sixth thin film transistor are connected together to form the third node.

12. The shift register unit according to claim 11, wherein the first thin film transistor, the second thin film transistor, the third thin film transistor, the fourth thin film transistor, the fifth thin film transistor, and the sixth thin film transistor are respectively provided with corresponding backup thin film transistors, and the connections of the respective backup thin film transistors are the same as those of the corresponding thin film transistors.

13. The shift register unit according to claim 12, further comprising a charging capacitor, one end of which is connected to the first node, and the other end of which is connected to the output terminal.

14. The shift register unit according to claim 12, wherein the first thin film transistor, the second thin film transistor, the third thin film transistor, the fourth thin film transistor, the fifth thin film transistor, and the sixth thin film transistor all are P-type transistors or N-type transistors.

15. The shift register unit according to claim 11, further comprising a charging capacitor, one end of which is connected to the first node, and the other end of which is connected to the output terminal.

16. The shift register unit according to claim 11, wherein the first thin film transistor, the second thin film transistor, the third thin film transistor, the fourth thin film transistor, the fifth thin film transistor, and the sixth thin film transistor all are P-type transistors or N-type transistors.

17. The shift register unit according to claim 4, further comprising a charging capacitor, one end of which is connected to the first node, and the other end of which is connected to the output terminal.

18. A gate drive circuit, comprising n shift register units connected in sequence, wherein n is a positive integer, and the shift register units are a shift register unit as in any one of claim 1 or 2-15; wherein the output module of the $i^{th}$ shift register unit is connected to the input module of the $i+1^{th}$ shift register unit to input the gate drive signal outputted from the $i^{th}$ shift register unit into the $i+1^{th}$ shift register unit as the frame start signal of the $i+1^{th}$ shift register unit, wherein $i \in [1, n)$ and i is a positive integer;

if the first clock signal input terminal of one of the shift register units is inputted with the first clock signal, and its second clock signal input terminal is inputted with the second clock signal, then the first clock signal input terminals of the previous shift register unit and the next shift register unit adjacent to the one shift register unit are both inputted with the second clock signal, and the second clock signal input terminals of the previous shift register unit and the next shift register unit adjacent to the one shift register unit are both inputted with the first clock signal; and the input module of the first shift register unit of the n shill register units is coupled with the frame start input signal from the external.

19. A display apparatus, comprising the gate drive circuit according to claim 18.

* * * * *